United States Patent
Hewitt et al.

(10) Patent No.: US 10,003,163 B2
(45) Date of Patent: Jun. 19, 2018

(54) POWER DISTRIBUTION UNIT

(71) Applicant: INTERNATIONAL BUSINESS MACHINES CORPORATION, Armonk, NY (US)

(72) Inventors: James Hewitt, Eastleigh (GB); Colin I. Holyoake, Braishfield (GB); Mark J. Lawrence, Eastleigh (GB); Caroline J. Thomas, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 15/238,386

(22) Filed: Aug. 16, 2016

(65) Prior Publication Data

US 2018/0054030 A1 Feb. 22, 2018

(51) Int. Cl.
*H01R 3/00* (2006.01)
*H01R 25/00* (2006.01)
(Continued)

(52) U.S. Cl.
CPC ......... *H01R 25/003* (2013.01); *H01R 13/639* (2013.01); *H01R 13/6683* (2013.01); *H01R 13/7175* (2013.01); *H01R 13/717* (2013.01)

(58) Field of Classification Search
CPC .................................................. H01R 13/717
(Continued)

(56) References Cited

U.S. PATENT DOCUMENTS

| 8,439,697 B2 | 5/2013 | Vass |
| 9,276,357 B2 | 3/2016 | Hutchison et al. |

(Continued)

FOREIGN PATENT DOCUMENTS

| CN | 103682859 A | 3/2014 |
| CN | 104393495 A | 3/2015 |

(Continued)

OTHER PUBLICATIONS

Anoynomous, IEC-lock's patented locking mechanism is beautifully simple . . . , http://www.ieclock.com/outlet_how.html, Aug. 2, 2016. (2 pages).

(Continued)

*Primary Examiner* — Tho D Ta
(74) *Attorney, Agent, or Firm* — Tutunjian & Bitetto, P.C.; Scott Dobson

(57) ABSTRACT

A power distribution unit (PDU) having a connector to connect to an input power supply and a plurality of power outlet sockets for receiving plugs having a number of pins. Each power outlet socket has a mechanical locking mechanism movable between a locked position and an unlocked position when a plug is inserted into the power outlet socket to lock and unlock a plug pin in the power outlet socket. Absent actuation the locked position is adopted. Each power outlet socket includes an externally, manually actuatable, first release element, and an internally, electrically actuatable, second release element. A power sensor detects whether or not power is being drawn and, for power outlet sockets which currently host a plug and are not drawing power, the second release element is actuated by the PDU so as to unlock the mechanical locking mechanism, thereby freeing up the associated plugs for removal.

13 Claims, 5 Drawing Sheets

(51) Int. Cl.
*H01R 13/66* (2006.01)
*H01R 13/717* (2006.01)
*H01R 13/639* (2006.01)

(58) Field of Classification Search
USPC .......................................................... 439/490
See application file for complete search history.

(56) References Cited

U.S. PATENT DOCUMENTS

| | | | |
|---|---|---|---|
| 2008/0026645 | A1 | 1/2008 | Naufel et al. |
| 2012/0015541 | A1 | 1/2012 | Lu |
| 2015/0004832 | A1* | 1/2015 | Homan ................ H01R 13/717 |
| | | | 439/490 |
| 2015/0064960 | A1 | 3/2015 | Chapel et al. |
| 2015/0357758 | A1 | 12/2015 | Krietzman et al. |

FOREIGN PATENT DOCUMENTS

| | | |
|---|---|---|
| CN | 104682106 A | 6/2015 |
| GB | 23132540 | 11/1997 |
| GB | 2463468 | 3/2011 |

OTHER PUBLICATIONS

Anoynomous, zLock Power Cord with Locking Mechanism, http://www.daxten.com/uk/zlock-power-cord-with-locking-mechanism.html. (2 pages).
Scott Good, Retainers Improve the Effectiveness of IEC Plugs, Uptime Institute, May 29, 2015. (11 pages).
Brittany Sheehan, Three Ways to Keep Your Power Cords Secured to Rack PDUs, Raritan, Jul. 6, 2015. (11 pages).
Patent Cooperation Treaty "Notification of Transmittal of the International Search Report and the Written Opinion of the International Searching Authority, or the Declaration" for PCT/IB2017/052367 dated Jul. 28, 2017, 11 pages.

* cited by examiner

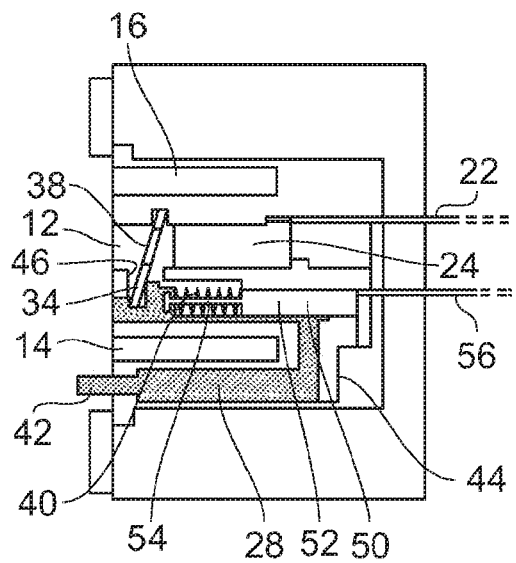

POWER DISTRIBUTION UNIT

BACKGROUND

Technical Field

The present disclosure relates to power distribution units, for example as used in racks for data centers.

Description of the Related Art

A typical data center is a home for many racks. A rack is a standard format housing for accommodating electrically powered devices. Each rack has multiple slots for accommodating electrically powered devices of standard "rack unit" dimensions. Common rack units are 19 inches and 23 inches. The slots can receive different kinds of electrically powered devices as desired, such as servers, storage area networks (SANs) and network switches. The number of slots, e.g., rack units, in a typical rack may be between six and forty-two.

Each rack can thus house different kinds of electrically powered devices, each of which has a power connector for receiving one end of a power cable, the other end of which is plugged into a power distribution unit (PDU). At the moment, power cables are commonly terminated with either a C14 plug or a C13 socket. A C14 plug has an earth (ground) pin and two power pins. The pins are generally of rectangular cross-section. A C13 socket has correspondingly shaped slots. The specifications of C14 plugs and C13 sockets are defined by International Electrotechnical Commission (IEC) specification IEC 60320.

A PDU is a familiar piece of equipment which has multiple power outlets for distributing electrical power to multiple electrically powered devices and is itself electrically powered by a power input connector. A PDU can vary from a simple device, such as those traditionally found in the home, to a more sophisticated device with in-built power smoothing, monitoring functions and so forth.

SUMMARY

According to an embodiment, a power distribution unit is provided. The power distribution unit includes a connector to connect an input power supply and a plurality of power outlet sockets for receiving plugs having a number of pins, each power outlet socket comprising a mechanical locking mechanism movable between a locked position and an unlocked position when a plug is inserted into the power outlet socket to lock and unlock a plug pin in the power outlet socket, wherein absent actuation the locked position is adopted, an externally, manually actuatable, first release element by which the mechanical locking mechanism can be moved from its locked position into its unlocked position, and an internally, electrically actuatable, second release element by which the mechanical locking mechanism can be moved from its locked position into its unlocked position.

According to an embodiment, a rack is provided having a plurality of rack unit slots for receiving a plurality of electrically powered devices in combination with a power distribution unit. The power distribution unit includes a connector to connect an input power supply and a plurality of power outlet sockets for receiving plugs having a number of pins, each power outlet socket comprising a mechanical locking mechanism movable between a locked position and an unlocked position when a plug is inserted into the power outlet socket to lock and unlock a plug pin in the power outlet socket, wherein absent actuation the locked position is adopted, an externally, manually actuatable, first release element by which the mechanical locking mechanism can be moved from its locked position into its unlocked position, and an internally, electrically actuatable, second release element by which the mechanical locking mechanism can be moved from its locked position into its unlocked position.

According to an embodiment, a method for an operator to maintain a rack unit is provided, when the power distribution unit is receiving power. The method includes identifying a power cable to be removed from the power distribution unit, checking whether the power cable is drawing power based on a visual indication from where the power cable is connected to the power distribution unit, and if the visual indication indicates that power is not being drawn by the power cable, removing the power cable from the power distribution unit.

BRIEF DESCRIPTION OF THE DRAWINGS

In the following, the present invention will further be described by way of example only with reference to exemplary embodiments illustrated in the figures.

FIG. 3A is a cross-sectional view showing a C13 socket which has an electro-mechanical locking mechanism and wherein the locking mechanism is in a locked position in accordance with the present principles;

FIG. 3B is a cross-sectional view showing the C13 socket of FIG. 3A wherein the locking mechanism in an unlocked position in accordance with the present principles;

FIG. 3C is a front view showing an end view of the C13 socket of FIG. 3A and FIG. 3B in accordance with the present principles;

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1A:
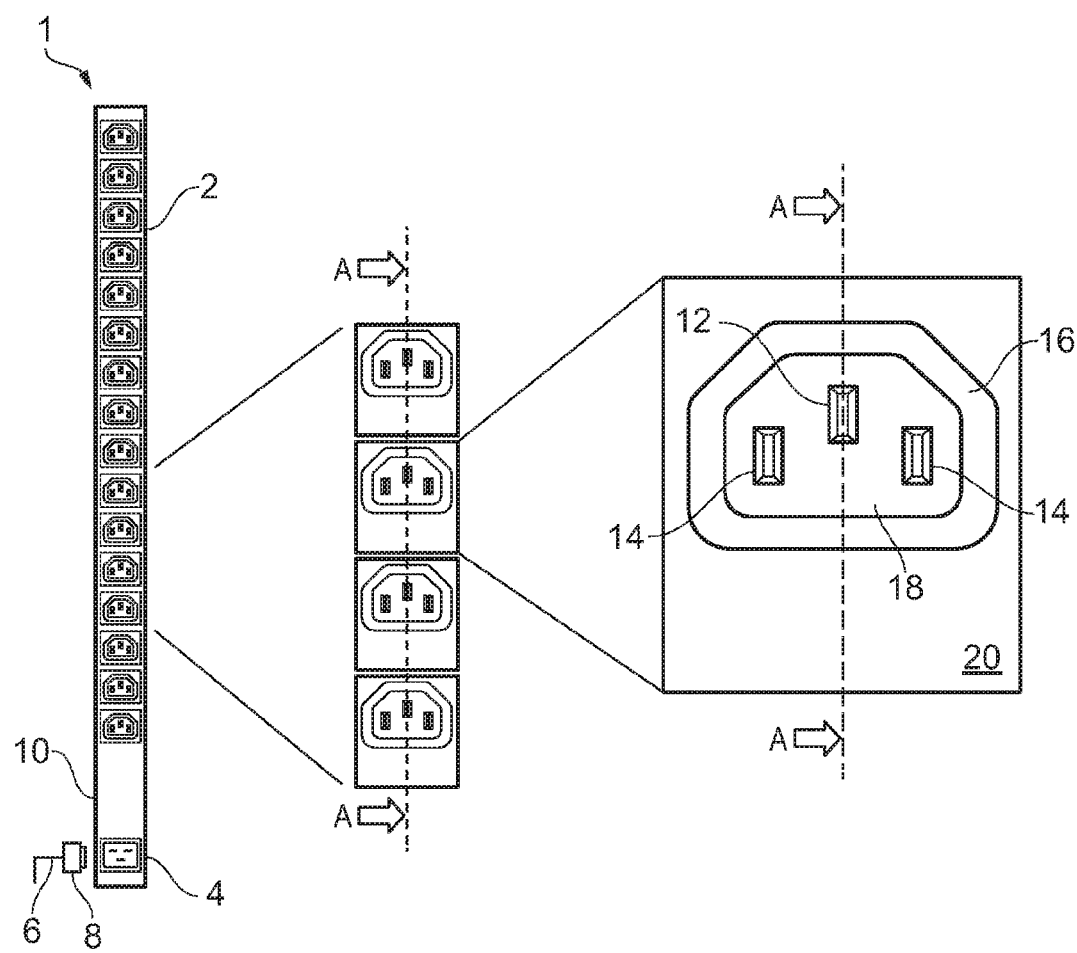
FIG. 1A is a front view showing a power distribution unit (PDU) with sixteen C13 sockets.

FIG. 1A shows an example generic PDU 1 with sixteen C13 sockets 2 arranged in a single column, with the left-hand panel of the illustration showing the whole PDU 1, the middle panel an expansion of four of the sockets 2 and the right-hand panel one of the sockets 2. PDU's come in many formats and may include multiple columns. The PDU 1 has its own power supply socket 4 with associated power supply cable 6 and plug 8 which are schematically shown unplugged. The PDU 1 also has a RJ45 network connector (not shown) so that it can be connected to the overall network and have its internal logic interrogated and possibly also reconfigured depending on the internal logic that the PDU 1 is provided with. Each socket 2 has in its end panel 20 a rectangular-section earth pin slot 12 and two rectangular-section main pin slots 14 for receiving the respective rectangular-section pins of a C14 plug, as well as a plug skirt recess channel 16 for receiving the skirt of a C14 plug. When a C14 plug is fully inserted into the C13 socket it will abut a socket end face 18 which is co-planar with, or parallel and slightly recessed relative to, the socket end panel 20.

Figure 1B:
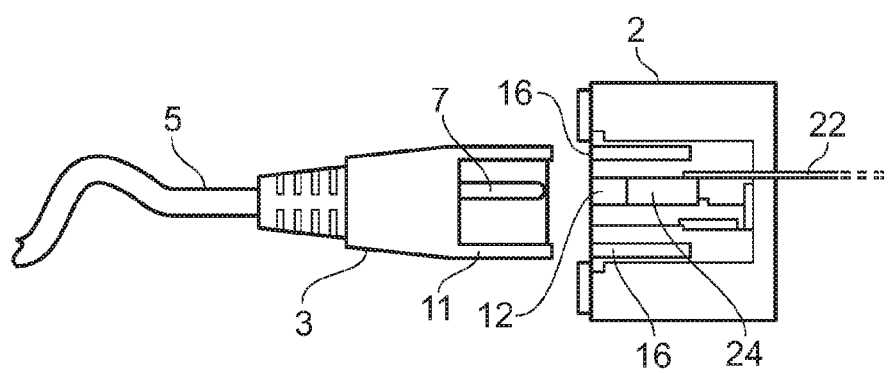
FIG. 1B is a cross-sectional view showing a section through line A-A of FIG. 1A showing a standard C13 socket with a standard C14 plug adjacent thereto.

FIG. 1B illustrates a vertical section through line A-A of FIG. 1A, e.g., through the middle of the earth pin slot 12, showing a standard C13 socket alongside a standard C14 plug.

In socket 2, the earth pin slot 12 and the plug skirt recess channel 16 are visible as well as an earth connector blade-type contact 24 with which the earth plug pin 7 forms an electrical connection when inserted. The earth connector contact 24 is electrically connected to an earth cable 22. A plug 3 with integral cable 5 has an earth pin 7 and a pair of main pins 9 (not visible in section A-A) which are shrouded by a skirt 11.

In a data center, the operator responsible for installing and maintaining rack units is often faced with the task of moving and interchanging devices, which requires power cables for the interchanging devices to be plugged in, unplugged, moved and so forth.

Ideally, the operator wants to have freedom to plug and unplug cables easily and quickly to aid setup and reconfiguration. However, the operator also does not want to cause damage or disruption by inadvertently unplugging a power cable from an operational device.

To avoid accidents, power cables in data centers often have mechanical locking mechanism which prevents them from being simply pulled out. To remove a cable, an operator needs to physically release the lock, e.g., by pinching either side of the plug to depress spring-loaded latches, or to hinge up a wire-formed lock mounted on the device and hinged over the plug.

A C13-format power outlet socket may incorporate a mechanical locking mechanism associated with the earth pin slot. The locking mechanism is movable between a locked position and an unlocked position. When the pins of a C14-format plug are inserted into the power outlet socket, the act of insertion urges the mechanical locking mechanism from its locked position into its unlocked position so that the earth pin (and hence also the power pins) can be freely inserted into the corresponding earth pin slot of the socket. Once the plug is fully inserted, a compression spring acts to urge the locking mechanism back into its locked position, thereby locking the earth pin and thus the plug in place. To release the plug from the socket, an externally, manually actuatable, release element is provided which an operator can press to move the mechanical locking mechanism from its locked position into its unlocked position. With this operator intervention, the plug can then be pulled out of the socket.

Figure 2A:
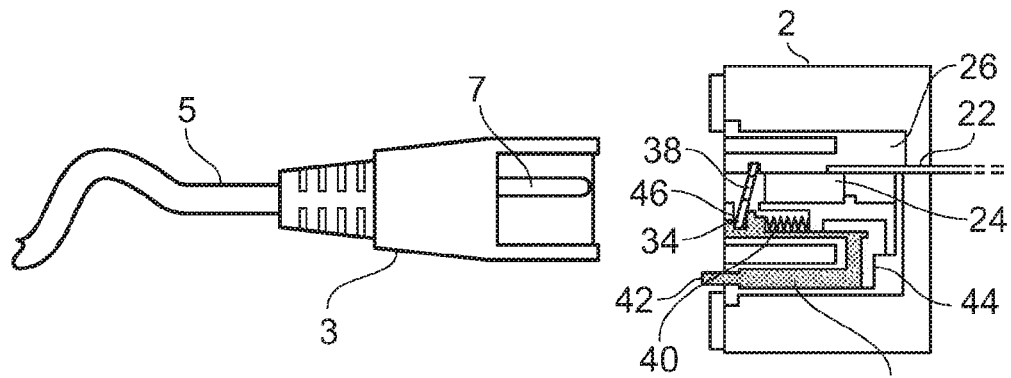
FIG. 2A is a cross-sectional view showing a non-standard prior art C13 socket, which, compared with a standard C13 socket, adds a mechanical locking mechanism for locking in place a standard C14 plug engaged therewith.

FIG. 2A shows a C13 socket together with an associated standard C14 plug. Common parts with the standard C13 socket already described above are given like reference numerals and not described again here for the sake of brevity. The principal parts of the mechanical locking mechanism are a hinged latch plate 34 and a sliding part 28. These are described in relation to a fixed part (or parts) of the socket 2, which is referred to in the following as a socket body 26. The hinged latch plate 34 is mounted to the socket body 26 by a hinge and, at its other end remote from the hinge, to the sliding part 28. The sliding part 28 is movable within the socket body 26 in the plugging direction such that its sliding motion moves the latch plate 34 through a range of angles one side of vertical. The latch plate 34 has a through hole 38, which is shaped and dimensioned to accept an earth pin 7 passing through it, when the latch plate 34 is in a vertical orientation, but to pinch, and thereby lock, an earth pin 7 when the latch plate 34 is tilted significantly away from vertical. The tilting of the latch plate 34 causes upper and lower edges of the through hole 38 to grip a pin which is passed through it. The vertical orientation is, therefore, an unlocked position, and an angled or tilted orientation is a locked position. A compression spring 40 biases the hinged latch plate 34 away from vertical, e.g., towards the locked position. The compression spring 40 is mounted between the socket body 26 and some part of the sliding part 28, thereby urging the sliding part 28 to move the hinged latch plate 34 to a locked position. The sliding part 28 also includes an externally, manually actuatable, release element 42 which extends out of the socket end panel 20, through an aperture therein, at least when the locking mechanism is in the locked position, so as to allow a user to press release element 42 and manually move the sliding part 28 against the bias of the compression spring 40 until the sliding part 28 meets an abutment 44 which arrests its inward movement at a position where the hinged latch plate 34 is in a vertical orientation. The outward movement of the sliding part 28 is limited by abutting the inner face 46 of the socket end face 18, which therefore defines the maximum angle away from vertical which the hinged latch plate 34 is able to adopt. Depressing the manual release element 42 therefore unlocks any plug which is in the socket, thereby allowing it to be withdrawn, e.g., unplugged. The manual release element 42 needs to be visible to an operator, so it is colored bright red.

As shown in FIG. 2A, when there is no plug in the socket, the compression spring 40 pushes the sliding part 28 as far is it will go outwards, into the maximum permitted angle away from vertical of the hinged latch plate 34. This is the locking position, although of course no locking is taking place.

The actions of inserting a plug 3 into the socket 2 and then withdrawing it are now described with reference to FIGS. 2B, 2C and 2D.

Figure 2B:
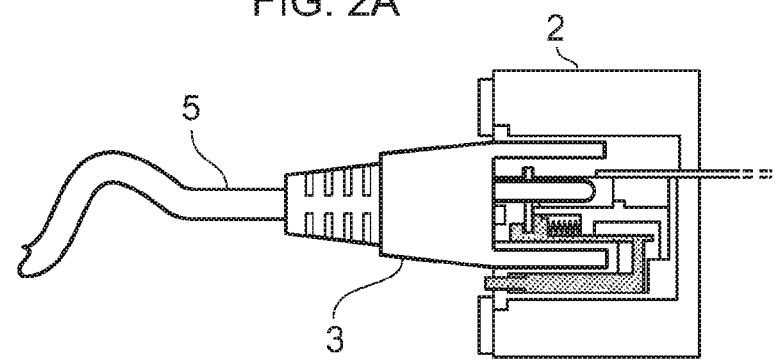
FIGS. 2B-2D are cross-sectional views showing the plug and socket of FIG. 2A as the C14 plug is in the course of being inserted, once the C14 plug is inserted and has been locked in place, and once the locking mechanism has been unlocked to enable removal of the plug.
Figure 2C:
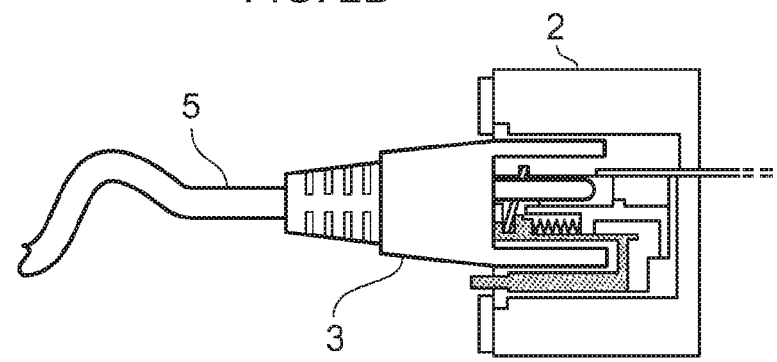
Figure 2D:
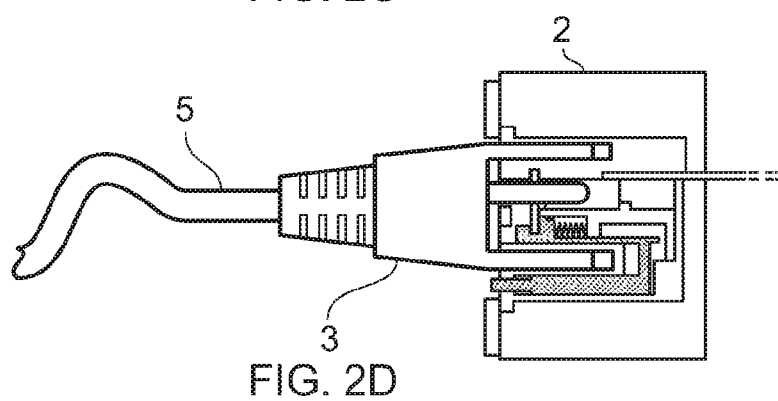

FIGS. 2B-2D show the plug 3 and socket 2 of FIG. 2A: as the C14 plug 3 is in the course of being inserted; once the C14 plug 3 is inserted and has been locked in place; and once the locking mechanism has been unlocked to enable removal of the plug 3.

FIG. 2B shows how, when a plug 3 is pushed into the socket 2, the earth pin 7 cannot initially pass through the through hole 38 of the latch plate 34, and so pushes the latch plate 34 away from its tilted orientation towards vertical. Once the latch plate 34 is sufficiently close to vertical, the earth pin 7 is able to slide through the through hole 38 and then the plug 3 can continue to be inserted over the remainder of the necessary travel until it is fully inserted.

FIG. 2C shows what happens after plug 3 insertion. Namely, once the plug 3 is fully inserted, or more precisely once the earth pin 7 has finished sliding through the through hole 38, the compression spring 40 urges the sliding part 28 back towards the locking position, e.g., urges the latch plate 34 away from vertical as far as it can until the edges of the through hole 38 bite on the earth pin 7 and lock it into place. In this locking position, as shown in FIG. 2C, the latch plate 34 is likely to be at some intermediate angle of its travel between vertical, e.g., as shown in FIG. 2B, and the angle it adopts when there is no plug 3 inserted, e.g., as shown in FIG. 2A. In the condition shown in FIG. 2C, if an operator pulls on the plug 3 to remove it, he will meet with resistance from the locking mechanism, which should alert him to the fact that perhaps it is not advisable to remove the plug 3 without checking the power status of the device which is being powered via that plug 3.

FIG. 2D shows how to release a plug 3 from the socket. As already mentioned, this is done by depressing the manual release element 42 with a finger or a tool, which pushes in the sliding part 28 and moves the latch plate 34 into its vertical position. The user can then pull out the plug 3 without resistance. The locking mechanism therefore means that a user is still free to pull out plugs 3 from sockets 4 in a PDU 1, but only when coupled with a conscious action of pressing the manual release element 42.

FIG. 3A and FIG. 3B show the same C13 socket according to an embodiment which has an electro-mechanical locking mechanism. FIG. 3A shows the socket with the locking mechanism in a locked position. FIG. 3B shows the socket with the locking mechanism in an unlocked position. FIG. 3C is an end view of the same socket. Corresponding parts with the prior art sockets already described above are given like reference numerals.

Before referring to features shown in FIG. 3A and in FIG. 3B, the socket of this embodiment is summarized briefly by way of comparison to the prior art socket. The prior art socket may be modified by adding an internally, electrically actuatable, second release element which provides an alternative and additional way to move the sliding part 28 between its locked and unlocked positions when the PDU 1 has power. The second release element comprises a solenoid with an electromagnetic coil and an armature, with the armature being urged by energizing the coil to actuate the second release element to move the sliding part 28 into the unlocked position. In the absence of electrical power being available to a PDU 1 of which the socket forms a part, the second release elements have no influence on the mechanical locking mechanisms. In the presence of electrical power, the second release element becomes active. Namely, each socket is provided with a power sensor to detect whether or not power is being drawn from it by a plug 3 inserted therein. If no power is detected, the second release element is actuated, in the sense of energizing the solenoid so as to move the mechanical locking mechanism into its unlocked position, overriding the bias of the compression spring 40. If power is detected, the second release element is actuated, in the sense of not energizing the solenoid, which allows the compression spring 40 to become dominant and move the mechanical locking mechanism into its locked position. For example, for those power outlet sockets which are detected as not drawing power, the power distribution unit can be also configured to actuate the first release elements via the second release elements. Consequently, when the PDU 1 has power, the operator is able to pull out a plug 3 from the socket 2 when no power is being drawn, but not so if power is being drawn. At the same time, the electro-mechanical locking provided by the solenoid can still be overridden manually by pressing the manual release element 42.

Referring now to FIG. 3A and FIG. 3B, the principal parts of the electro-mechanical locking mechanism are a hinged latch plate 34, a sliding part 28, a compression spring 40 and a solenoid 50. The solenoid 50 comprises an electromagnetic coil 52 and an armature rod 54, wherein the coil 52 is energized by supplying electrical power through a power cable 56. The armature rod 54 is free to move axially relative to the coil 52 in and out of an armature opening at one end of the coil 52. The other end of the coil 52 is closed. The compression spring 40 is conveniently arranged so that it is sleeved over the armature rod 54, e.g., axially concentric therewith. In the socket 2, the earth pin slot 12 and the plug skirt recess channel 16 are visible as well as an earth connector blade-type contact 24 with which the earth plug pin 7 forms an electrical connection when inserted. The earth connector contact 24 is electrically connected to an earth cable 22.

The moving parts, e.g., the sliding part 28, the hinged latch plate 34 and the armature 54, are described in relation to a fixed part (or parts) of the socket 2, which is referred to in the following as a socket body 26. The hinged latch plate 34 is mounted to the socket body 26 by a hinge and, at its other end remote from the hinge, to the sliding part 28. The sliding part 28 is movable within the socket body 26 in the plugging direction such that its sliding motion moves the latch plate 34 through a range of angles one side of vertical. The latch plate 34 has a through hole 38, which is shaped and dimensioned to accept an earth pin 7 passing through it, when the latch plate 34 is in a vertical orientation, but to pinch, and thereby lock, an earth pin 7 when the latch plate 34 is tilted significantly away from vertical. The tilting of the latch plate 34 causes upper and lower edges of the through hole 38 to grip a pin which is passed through it. The vertical orientation is therefore an unlocked position, and an angled or tilted orientation is a locked position.

A compression spring 40 biases the hinged latch plate 34 away from vertical, e.g., towards the locked position. The compression spring 40 should be mounted between the socket body 26 and some part of the sliding part 28, thereby urging the sliding part 28 to move the hinged latch plate 34 to a locked position. In the illustrated embodiment, the compression spring 40 is sleeved over the armature 54, as already mentioned above, but a separate location is also contemplated. The sliding part 28 also includes an externally, manually actuatable, release element 42 which extends out of the socket end panel 20, through an aperture therein, at least when the locking mechanism is in the locked position, so as to allow a user to press the release element 42 and manually move the sliding part 28 against the bias of the compression spring 40 until the sliding part 28 meets an abutment 44 which arrests its inward movement at a position where the hinged latch plate 34 is in a vertical orientation. The outward movement of the sliding part 28 is limited by abutting the inner face 46 of the socket end face 18, which therefore defines the maximum angle away from vertical which the hinged latch plate 34 is able to adopt. Depressing the manual release element 42 therefore unlocks any plug 3 which is in the socket, thereby allowing it to be withdrawn, e.g., unplugged.

The compression spring 40 is a helical coil spring and therefore has a cylindrical free space running along its principal axis. In this cylindrical free space there is fitted the armature rod 54, so that the compression spring 40 is sleeved over it. The end of the solenoid 50 which is remote from the armature opening is arranged fixed to some part of the socket body 26. The other end of the solenoid 50, more specifically the distal end of the armature rod 54, is fixed to the sliding part 28.

When the solenoid coil 52 is energized (which is done when no power is being drawn from the socket 2 or the PDU 1 itself is not powered), the resulting electromotive force attracts the armature rod 54 into the armature opening (e.g., from left to right in FIG. 3B) and moves the sliding part 28 into the position shown in FIG. 3B. Here it is noted that the electromotive force needs to be strong enough to overcome the biasing force of the compression spring 40 which is acting in the opposite direction.

When the solenoid coil 52 is not energized (which is done when power is being drawn from the socket 2), the armature rod 54 is subject to no electromotive force from the coil 52, so merely follows the sliding part 28. Since the force from the compression spring 40 is present, the force from the compression spring 40 will dominate absent any electromotive force (or external actuation via element 42) and move the sliding part 28 into the locked position and with it pull out the armature rod 54 (e.g., from right to left in FIG. 3A) from the coil 52 into the position shown in FIG. 3A.

In FIG. 3C, the end view, emitter lights 80 and 82 are also shown mounted in the socket end panel 20, the function of which is described further below in relation to FIG. 5. The manual release element 42 is also labelled.

This design can provide a simple and intuitive indication to an operator of which power cables can be safely removed and, moreover, simply pulled out since they are not locked. Compared with the known purely mechanical solution described above, this can dramatically reduce the amount of times that an operator needs to externally, manually actuate a release element during installation and maintenance. This is additionally beneficial because these release elements are often difficult to access, especially when neighbouring sockets on a PDU are occupied, meaning that plugs are close together.

Figure 4A:
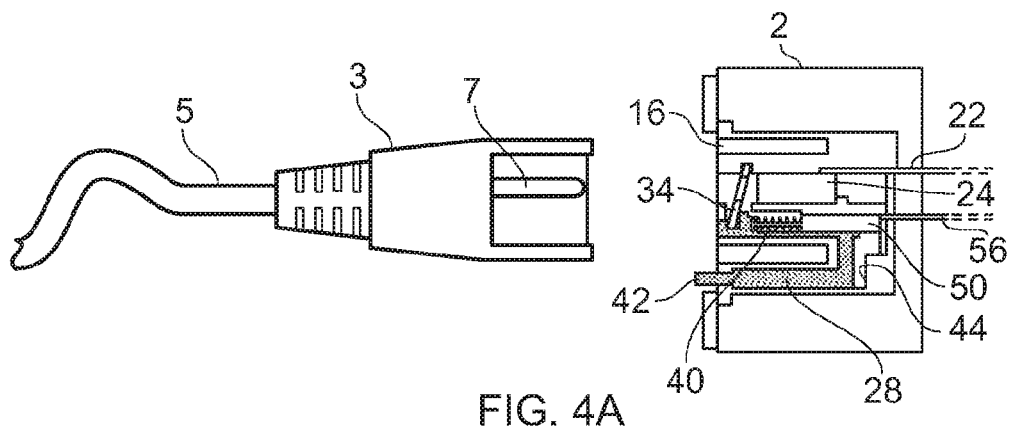
FIGS. 4A to 4D are cross-sectional views showing the socket of FIG. 3A to 3C in accordance with the present principles.

FIG. 4A shows the same C13 socket 2 as described above with reference to FIGS. 3A to 3C together with a standard C14 plug 3 when they are separated from each other, e.g., prior to insertion of the plug 3 into the socket 2. The socket 2 of FIG. 4A is in the same state as that of FIG. 3A. The plug 3 of FIG. 4A is identical to that of FIG. 1B or FIG. 2A.

The actions of inserting a plug 3 into the socket 2 and then withdrawing it are now described with reference to FIGS. 4B, 4C and 4D.

Figure 4B:
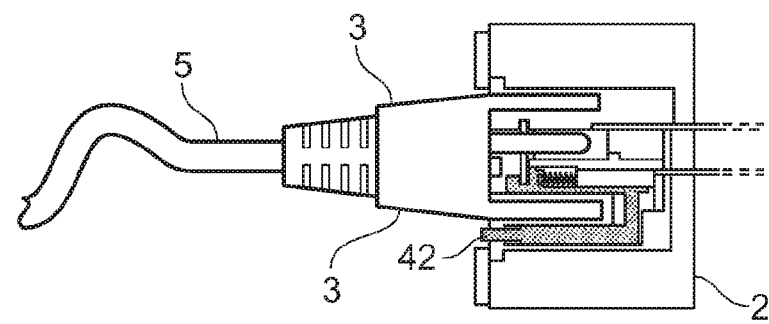
Figure 4C:
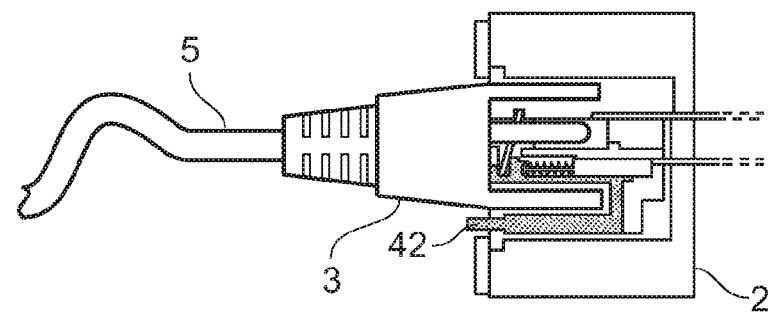
Figure 4D:
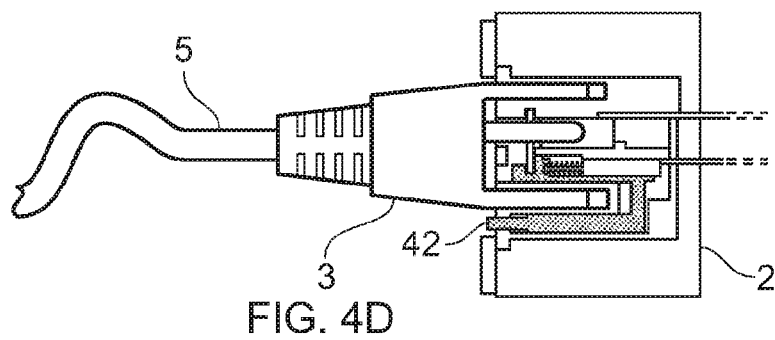

FIGS. 4B-4D show the plug 3 and socket 2 of FIG. 4A as the C14 plug 3 is in the course of being inserted, once the C14 plug 3 is inserted and is locked in place, and when the locking mechanism is unlocked to enable removal of the plug 3.

FIG. 4B shows how, when a plug 3 is pushed into the socket 2, the earth pin 7 cannot initially pass through the through hole 38 of the latch plate 34, and so pushes the latch plate 34 away from its tilted orientation towards vertical. Once the latch plate 34 is sufficiently close to vertical, the earth pin 7 is able to slide through the through hole 38 and then the plug 3 can continue to be inserted over the remainder of the necessary travel until it is fully inserted.

FIG. 4C shows what happens after plug insertion in the case that power is being drawn via the power cable 56. Namely, once the plug 3 is fully inserted, or more precisely once the earth pin 7 has finished sliding through the hole 38, the compression spring 40 urges the sliding part 28 back towards the locking position, e.g., urges the latch plate 34 away from vertical as far as it can until the edges of the through hole 38 bite on the earth pin 7 and lock it into place. In this locking position, as shown in FIG. 4C, the latch plate 34 is likely to be at some intermediate angle of its travel between vertical, e.g., as shown in FIG. 4B, and the angle it adopts when there is no plug 3 inserted, e.g., as shown in FIG. 4A. In the condition shown in FIG. 4C, if an operator pulls on the plug 3 to remove it, he will meet with resistance from the locking mechanism. In this case, when power draw is detected, the second release element is actuated, in the sense of not energizing the solenoid 50, which allows the compression spring 40 to become dominant and move the mechanical locking mechanism into its locked position. In other words, the lock mechanism functions as if the second release element were not present. It is noted that the electromechanical locking provided in this embodiment by the solenoid 50 can still be overridden manually by pressing the manual release element 42.

FIG. 4D shows how to release a plug 3 from the socket 2. If power is not being drawn via the power cable 56 and assuming the PDU 1 has power, then the second release element is actuated, in the sense of energizing the solenoid 50 so as to move the mechanical locking mechanism into its unlocked position, overriding the bias of the compression spring 40. Consequently, the operator is able to pull out the plug 3 since no power is being drawn. The manual release element 42 is thus effectively automatically depressed by the solenoid 50, which has pushed in the sliding part 28 and moved the latch plate 34 into its vertical position. On the other hand, if the PDU 1 has no power, the solenoid 50 cannot be actuated and the socket 2 reverts to the mechanical release option, whereby a user can depress the manual release element 42 with a finger or a tool to unlock the lock mechanism.

Figure 5:
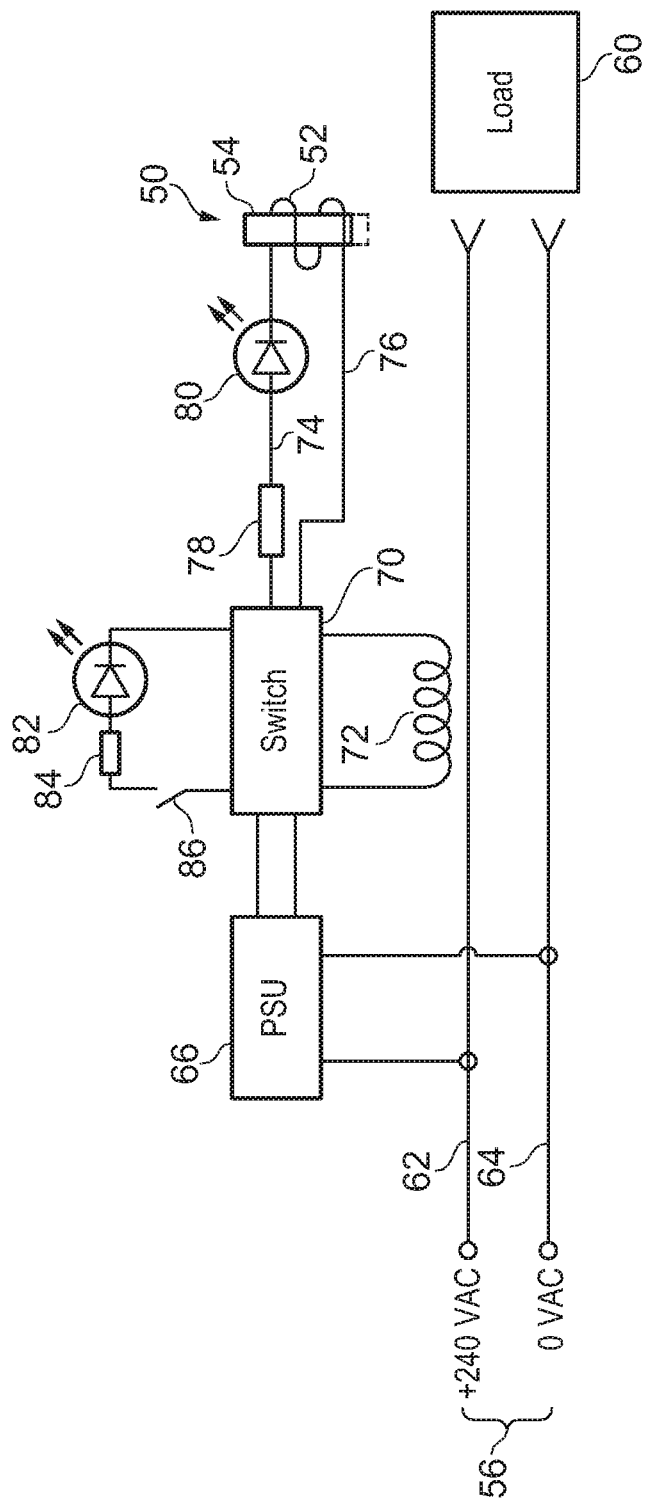
FIG. 5 is a circuit diagram showing the circuit incorporated in the socket of FIGS. 3A to 3C to control the locking mechanism in accordance with the present principles.

FIG. 5 is a circuit diagram showing the circuit incorporated in the socket 2 of FIGS. 3A to 3C in order to control the locking mechanism, e.g., to drive the solenoid 50 conditional on the load status of a power outlet socket. The previously described solenoid 50 with its coil 52 and rod 54 are shown to the right of the figure. The external load is represented by a load 60, which may or may not be connected to and drawing power from the previously described power cable 56 which comprises live and earth alternating current lines 62 and 64. A power supply unit (PSU) 66 is connected to the power cable 56 and represents an AC to DC converter for generating low voltage DC, e.g., 5V or 12V, for powering the solenoid 50. Power is supplied from the PSU 66 to the solenoid 50 conditional on the status of a switch 86 which is part of an inductive proximity sensor 70 which includes an inductive coil 72 arranged to sense the magnetic field created by current in the live AC line 62. The switch 86 is thus closed when current flows in the live AC line 62. The drive circuit for the solenoid 50 comprises positive and ground lines 74 and 76 to the solenoid coil 52. A current limiting resistor 78 is also shown arranged in the positive DC line 74.

In addition, a first light emitting diode 80 is arranged in the positive DC line 74 to act as a first light emitter indicating the status of the solenoid 50, e.g., to emit light conditional on sensing that a plug 3 is inserted into the relevant power outlet socket is drawing power. In this condition, the first light emitter 80 is a warning light, e.g., of a red color, to indicate to an installer or maintenance engineer that the cable should not be removed. A second light emitting diode 82 with in line resistor 84 is also provided. The second light emitting diode 82 serves as a second light emitter and is connected to the inductive proximity sensor 70 such that it is energized if there is no magnetic field sensed by the inductive coil 72, e.g., if there is no current in the live AC line 62. The second light emitter 82 is a permissive light, e.g., of a green color, to indicate to an installer or maintenance engineer that no power is being drawn from that socket, so a power cable plugged into that socket 2 can be safely removed from the PDU 1.

It may be advantageous for each power outlet socket 2 to include a light emitter assembly to emit light conditional on the power sensor 70, 72 detecting that the power outlet socket 2 is drawing power and/or is not drawing power. The light may be emitted further conditional on sensing that a plug 3 is inserted into its power outlet socket 2. For example, the light may be emitted in a first color conditional on sensing that its power outlet socket 2 is drawing power and a second color conditional on sensing that its power outlet socket is not drawing power. An alternative to using color to distinguish whether the socket is drawing power or not, may include flashing (e.g., for drawing power) and non-flashing (e.g., for not drawing power) of the same light or light color.

An additional switch 86 may be included for the second light emitter 82, which is in an open state when no plug 3 is inserted in the socket 2 and in a closed state when a plug 3 is inserted in the socket 2. The additional switch 86 is thus switched according to the physical status of the socket 2, e.g., whether it has a plug 3 inserted into it, rather than the electrical status. A suitable additional switch 86 would be an optical make-and-break circuit comprising a light emitter and sensor pair, wherein insertion of a plug 3 blocks the light path from emitter and sensor. Another suitable additional switch 86 would be one triggered by the mechanical status of the socket 2, e.g., by the angle of the hinged latch plate 34, or by the sliding part 28 meeting the abutment 44. The function of the additional switch 86 is thus to prevent the second light emitter 82 from being energized unless a plug 3 is inserted in the socket 2. In other words, empty sockets in the PDU 1 do not have any glowing lights, whether permissive or warning lights. On the other hand, occupied sockets in the PDU 1 either have a glowing (red) warning light or a glowing (green) permissive light.

It will be understood that FIG. 5 is a simplified circuit diagram made for the purpose of illustrating the design principles, and that more sophisticated circuit elements may be used, such as an intelligent coil driver using pulse width modulation. It will also be appreciated that the first and second light emitters 80, 82 may be integrated into a single light emitting unit, e.g., a single lens, operable to emit two different colors. It will be further appreciated that the first and second light emitters 80, 82 may have their functions incorporated into a single light emitter, e.g., flashing for warning and constant for permissive or vice versa. The light emitters and associated drive circuits constitute a light emitter assembly for each socket 2 of the PDU 1.

According to an embodiment, a rack is provided that houses a plurality of electrically powered devices with respective power connections connected by respective cables to a power distribution unit 1. In some embodiments, the rack has a plurality of rack unit slots for receiving a plurality of electrically powered devices in combination with a power distribution unit 1.

In summary, a PDU 1 has been described which has its power outlet sockets 2 provided with a hybrid pure mechanical and electro-mechanical locking mechanism, rather than the pure mechanical locking mechanism. When no power is provided to the PDU 1, all sockets 2 are in 'lock' mode. However, when a PDU 1 has a power source, it electro-mechanically takes all sockets 2 not experiencing a draw out of 'lock' mode into 'unlock' mode. This allows the installer to remove these cables easily, and without fear of accidentally taking down an operational rack unit. However, if the PDU 1 does sense a power draw from one of its sockets 2, that socket 2 will then 'lock' the plug 3 into place. If an installer/maintainer then pulls on that power lead, the plug 3 will not release easily, indicating to the installer that the power lead is connected to an operational rack unit. The sockets 2 still have a manual release actuator element 42 that allows the plug 3 to be released if required, even if there is no power supply to the PDU 1.

The embodiments and drawings as described above relate to a C13/C14 plug/socket combination, but it will be appreciated that the principles may be applied to any plug/socket combination with a pin that can be captured as described. Specifically, a C19/C20 plug/socket combination may be employed as one alternative.

An alternative design with the electro-mechanical elements housed in a plug 3 instead of a socket 2 can also be realized, e.g., for a plug-based PDU.

In summary, a PDU 1 includes a connector 4 for connecting to an input power supply and a plurality of power outlet sockets 2 for receiving plugs 3 having a number of pins 7, 9. Each power outlet socket 2 has a mechanical locking mechanism 28, 34, 38, 40 movable between a locked position and an unlocked position when a plug 3 is inserted into the power outlet socket 2 to lock and unlock a plug pin in the power outlet socket 2. Absent actuation, the locked position is adopted. Each power outlet socket 2 additionally has an externally, manually actuatable, first release element 42, as well as an internally, electrically actuatable, second release element 50, 52, 54. A power sensor 70, 72 is operable to detect whether or not power is being drawn and, for those sockets 2 which currently host a plug 3 and are not drawing power, the second release element 50, 52, 54 is actuated by the PDU 1 so as to unlock the mechanical locking mechanism 28, 34, 38, 40, thereby freeing up the associated plugs 3 for removal.

The invention claimed is:

1. A power distribution unit having a connector to connect an input power supply and a plurality of power outlet sockets for receiving plugs having a number of pins, each power outlet socket comprising:
   a mechanical locking mechanism movable between a locked position and an unlocked position when a plug is inserted into the power outlet socket to lock and unlock a plug pin in the power outlet socket, wherein absent actuation the locked position is adopted;
   an externally, manually actuatable, first release element by which the mechanical locking mechanism can be moved from its locked position into its unlocked position; and
   an internally, electrically actuatable, second release element by which the mechanical locking mechanism can be moved from its locked position into its unlocked position.

2. The unit of claim 1, further comprising a power sensor to detect whether or not power is being drawn from at least power outlet sockets which have plugs inserted therein, and wherein, for sockets which are detected as not drawing power, the power distribution unit is configured to actuate their respective second release element so as to move their respective mechanical locking mechanism into its unlocked position.

3. The unit of claim 2, wherein, for the power outlet sockets which are detected as not drawing power, the power distribution unit is also configured to actuate the first release element via the second release element.

4. The unit of claim 1, wherein absent the power distribution unit having electrical power, the second release element has no influence on the mechanical locking mechanism.

5. The unit of claim 1, wherein the second release element comprises a solenoid with an electromagnetic coil and an armature, with the armature being urged by energizing the electromagnetic coil to actuate the second release element.

6. The unit of claim 1, wherein each power outlet socket includes an externally visible part which adopts first and second positions following the locked and unlocked positions of the mechanical locking mechanism.

7. The unit of claim 2, wherein each power outlet socket includes a light emitter assembly to emit light conditional on the power sensor detecting that a power outlet socket is drawing power and/or is not drawing power.

8. The unit of claim 7, wherein said light is emitted further conditional on sensing that a plug is inserted into the power outlet socket.

9. The unit of claim 7, wherein said light is emitted in a first color conditional on sensing that the power outlet socket is drawing power and a second color conditional on sensing that the power outlet socket is not drawing power.

10. The unit of claim 1, further comprising a rack housing a plurality of electrically powered devices with respective power connections connected by respective cables to the power distribution unit.

11. A rack having a plurality of rack unit slots for receiving a plurality of electrically powered devices in combination with a power distribution unit, the power distribution unit having a connector to connect an input power supply and a plurality of power outlet sockets for receiving plugs having a number of pins, each power outlet socket comprising:
   a mechanical locking mechanism movable between a locked position and an unlocked position when a plug is inserted into the power outlet socket to lock and unlock a plug pin in the power outlet socket, wherein absent actuation the locked position is adopted;
   an externally, manually actuatable, first release element by which the mechanical locking mechanism can be moved from its locked position into its unlocked position; and
   an internally, electrically actuatable, second release element by which the mechanical locking mechanism can be moved from its locked position into its unlocked position.

12. A method for an operator to maintain a rack having a plurality of rack unit slots for receiving a plurality of electrically powered devices in combination with a power distribution unit, when the power distribution unit is receiving power, the method comprising:
   identifying a power cable to be removed from the power distribution unit;
   checking whether the power cable is drawing power based on a first visual indication from where the power cable is connected to the power distribution unit, said first visual indication being provided if the power cable is drawing power; and
   removing the power cable from the power distribution unit if the first visual indication indicates that power is not being drawn by the power cable.

13. The method of claim 12, wherein checking whether the power cable is drawing power includes:
   powering down the electrically powered device to which the power cable is connected if the first visual indication indicates that power is being drawn by the power cable;
   rechecking whether the power cable is drawing power based on a second visual indication from where the power cable is connected to the power distribution unit; and
   removing the power cable from the power distribution unit once the second visual indication indicates that power is no longer being drawn by the power cable.

* * * * *